(12) United States Patent
Matsui et al.

(10) Patent No.: US 9,920,425 B2
(45) Date of Patent: Mar. 20, 2018

(54) SEMICONDUCTOR MANUFACTURING APPARATUS AND MANUFACTURING METHOD OF SEMICONDUCTOR DEVICE

(71) Applicant: Toshiba Memory Corporation, Minato-ku (JP)

(72) Inventors: Takayuki Matsui, Kuwana (JP); Hajime Nagano, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 452 days.

(21) Appl. No.: 14/574,534

(22) Filed: Dec. 18, 2014

(65) Prior Publication Data

US 2016/0047046 A1 Feb. 18, 2016

Related U.S. Application Data

(60) Provisional application No. 62/036,699, filed on Aug. 13, 2014.

(51) Int. Cl.
| | | |
|---|---|---|
| *C23C 16/44* | (2006.01) | |
| *C23C 16/34* | (2006.01) | |
| *C23C 16/455* | (2006.01) | |
| *H01L 21/02* | (2006.01) | |

(52) U.S. Cl.
CPC ........ *C23C 16/4412* (2013.01); *C23C 16/345* (2013.01); *C23C 16/45502* (2013.01); *C23C 16/45546* (2013.01); *H01L 21/0217* (2013.01); *H01L 21/0228* (2013.01); *H01L 21/02211* (2013.01)

(58) Field of Classification Search
CPC ......... C23C 16/4412; C23C 16/45546; C23C 16/345; C23C 16/45502; H01L 21/0217; H01L 21/02211; H01L 21/0228
See application file for complete search history.

(56) References Cited

U.S. PATENT DOCUMENTS

| | | | | |
|---|---|---|---|---|
| 5,013,400 A | * | 5/1991 | Kurasaki | ........... H01L 21/31116 156/345.26 |
| 5,091,207 A | * | 2/1992 | Tanaka | ..................... C23C 16/52 118/50 |
| 5,484,484 A | * | 1/1996 | Yamaga | ................ C23C 16/345 118/715 |

(Continued)

FOREIGN PATENT DOCUMENTS

| | | | | | |
|---|---|---|---|---|---|
| JP | 61017151 A | * | 1/1986 | ......... | C23C 16/4412 |
| JP | 61017151 A | * | 1/1986 | ......... | C23C 16/4412 |

(Continued)

*Primary Examiner* — Rudy Zervigon
(74) *Attorney, Agent, or Firm* — Oblon, McClelland, Maier & Neustadt, L.L.P.

(57) ABSTRACT

A semiconductor manufacturing apparatus according to an embodiment includes a chamber that is capable of accommodating therein a plurality of semiconductor substrates. A gas supply part supplies process gas to the chamber. A top exhaust port is connected to a top portion of the chamber and exhausts gas within the chamber. A bottom exhaust port is connected to a bottom portion of the chamber and exhausts gas within the chamber. A controller controls a timing of supplying process gas from the gas supply part and a timing of switching between exhaust from the top exhaust port and exhaust from the bottom exhaust port.

5 Claims, 5 Drawing Sheets

(56) References Cited

U.S. PATENT DOCUMENTS

| | | | | |
|---|---|---|---|---|
| 6,217,937 | B1 * | 4/2001 | Shealy | C23C 16/44 |
| | | | | 118/712 |
| 6,291,800 | B1 * | 9/2001 | Shirakawa | G03F 7/168 |
| | | | | 118/724 |
| 6,806,211 | B2 * | 10/2004 | Shinriki | C23C 16/40 |
| | | | | 118/715 |
| 6,921,456 | B2 * | 7/2005 | Biberger | H01L 21/67051 |
| | | | | 118/715 |
| 7,020,981 | B2 * | 4/2006 | Shero | C23C 16/4412 |
| | | | | 118/715 |
| 7,255,772 | B2 * | 8/2007 | Biberger | H01L 21/67051 |
| | | | | 118/715 |
| 7,271,096 | B2 * | 9/2007 | Sandhu | C23C 16/045 |
| | | | | 257/E21.002 |
| 9,103,029 | B2 * | 8/2015 | Wamura | C23C 16/4412 |
| 9,340,879 | B2 * | 5/2016 | Yahata | C23C 16/4405 |
| 2008/0014351 | A1 * | 1/2008 | Inoue | C23C 16/345 |
| | | | | 427/255.28 |
| 2008/0213479 | A1 * | 9/2008 | Chou | C23C 16/36 |
| | | | | 427/255.393 |
| 2011/0203524 | A1 * | 8/2011 | Uno | C23C 16/405 |
| | | | | 118/730 |
| 2011/0312188 | A1 * | 12/2011 | Wamura | C23C 16/4412 |
| | | | | 438/758 |
| 2012/0222813 | A1 * | 9/2012 | Pal | C23C 16/4412 |
| | | | | 156/345.31 |
| 2016/0047046 | A1 * | 2/2016 | Matsui | C23C 16/4412 |
| | | | | 438/758 |

FOREIGN PATENT DOCUMENTS

| | | | | |
|---|---|---|---|---|
| JP | 61019779 A | * | 1/1986 | C23C 16/50 |
| JP | 64-49218 | | 2/1989 | |
| JP | 3355238 | | 12/2002 | |
| JP | 2011-171566 | | 9/2011 | |

* cited by examiner

SEMICONDUCTOR MANUFACTURING APPARATUS AND MANUFACTURING METHOD OF SEMICONDUCTOR DEVICE

CROSS REFERENCE TO RELATED APPLICATIONS

This application is based upon and claims the benefit of priority from the prior U.S. Provisional Patent Application No. 62/036,699 filed on Aug. 13, 2014, the entire contents of which are incorporated herein by reference.

FIELD

The embodiments of the present invention relate to a semiconductor manufacturing apparatus and a manufacturing method of semiconductor device.

BACKGROUND

Among semiconductor manufacturing apparatuses such as a film formation device, there is a batch-type semiconductor manufacturing apparatus that processes a plurality of semiconductor wafers simultaneously. A conventional batch-type semiconductor manufacturing apparatus introduces source gas, reactant gas, or the like in a vacuum chamber and exhausts these gas from a bottom portion of the chamber.

However, in such a case, a gas retention time in a top portion of the chamber is longer than that in the bottom portion thereof. That is, gas concentration in the top portion of the chamber is higher than that in the bottom portion thereof. For this reason, the film thickness of a material formed on a semiconductor wafer varies depending on the position of the semiconductor wafer within the chamber. For example, a relatively thin film is formed on a semiconductor wafer arranged in the bottom portion of the chamber, and a relatively thick film is formed on a semiconductor wafer arranged in the top portion of the chamber.

To suppress such a variation in the film thickness, it is conceivable that temperatures of respective portions in the chamber are adjusted. However, when process temperatures are changed, the film quality (for example, stress and the like) also changes. Accordingly, in the conventional batch-type semiconductor manufacturing apparatus, it has been difficult to uniformize the film thickness and the film quality among semiconductor wafers.

DETAILED DESCRIPTION

Embodiments will now be explained with reference to the accompanying drawings. The present invention is not limited to the embodiments.

A semiconductor manufacturing apparatus according to an embodiment includes a chamber that is capable of accommodating therein a plurality of semiconductor substrates. A gas supply part supplies process gas to the chamber. A top exhaust port is connected to a top portion of the chamber and exhausts gas within the chamber. A bottom exhaust port is connected to a bottom portion of the chamber and exhausts gas within the chamber. A controller controls a timing of supplying process gas from the gas supply part and a timing of switching between exhaust from the top exhaust port and exhaust from the bottom exhaust port.

First Embodiment

Figure 1:
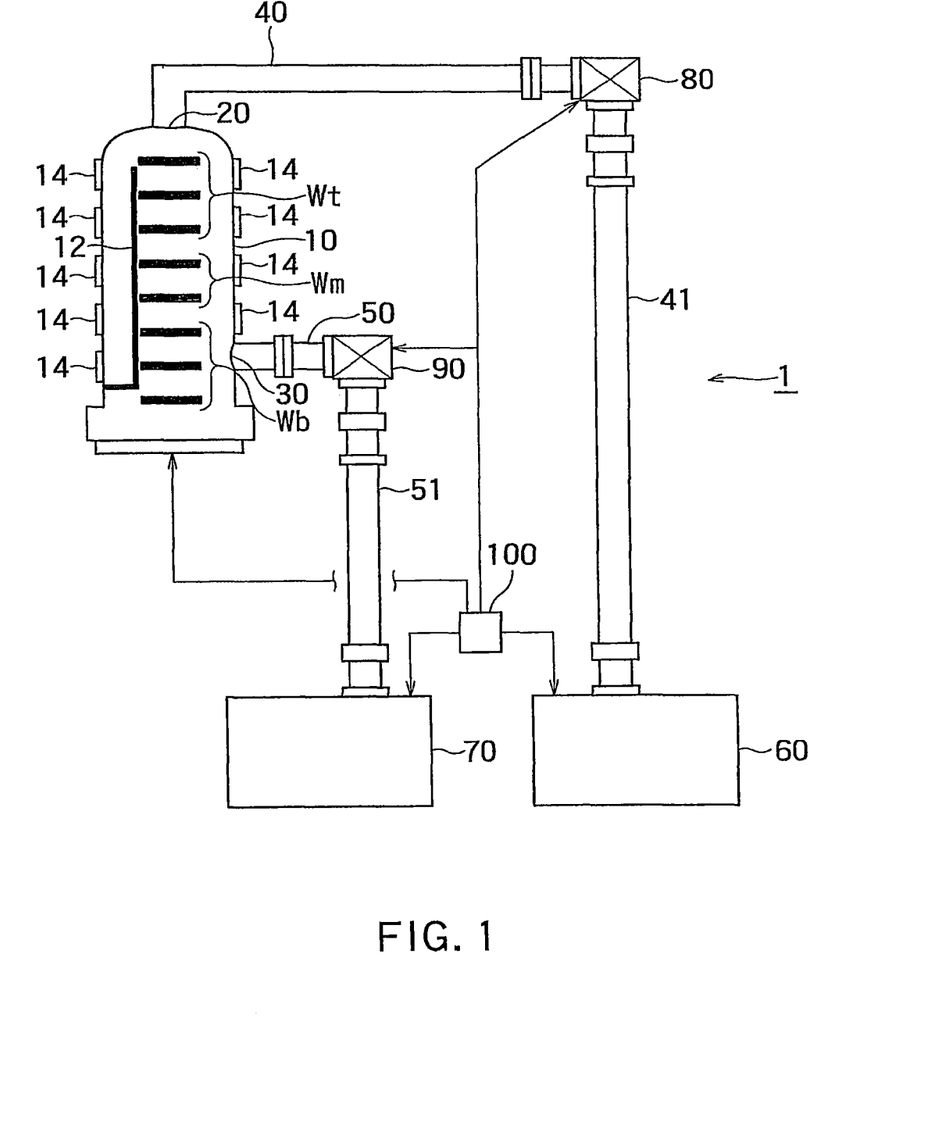
FIG. 1 is a configuration diagram of an example of a film formation device 1 according to a first embodiment.

FIG. 1 is a configuration diagram of an example of a film formation device 1 according to a first embodiment. The film formation device 1 can be an arbitrary batch-type film formation device such as a CVD (Chemical Vapor Deposition) device and an ALD (Atomic Layer Deposition) device. The first embodiment can also be applied to, in addition to a film formation device, a batch-type etching device, a batch-type thermal processing device, and the like. A film formation device is explained below as an example of the first embodiment.

The film formation device 1 according to the first embodiment includes a chamber 10, a gas supply part 12, heaters 14, a top exhaust port 20, a bottom exhaust port 30, first exhaust pipes 40 and 41, second exhaust pipes 50 and 51, a first exhaust pump 60, a second exhaust pump 70, a first switching valve 80, a second switching valve 90, and a controller 100.

The chamber 10 can accommodate therein a plurality of semiconductor substrates Wt, Wm, and Wb, and vacuum drawing is made in the chamber 10. For example, the chamber can accommodate therein 50 to 150 semiconductor substrates and these semiconductor substrates can be processed simultaneously. The semiconductor substrates Wt are arranged in a top portion of the chamber 10, the semiconductor substrates Wm are arranged in a middle portion of the chamber 10, and the semiconductor substrates Wb are arranged in a bottom portion of the chamber 10.

The gas supply part 12 supplies process gas (source gas or reactant gas) to the chamber 10. For example, when the film formation device 1 is a thermal ALD device and a silicon nitride film is to be formed on a semiconductor substrate, the gas supply part 12 supplies DCS (dichlorosilane) gas and ammonium gas to the chamber 10 as process gas.

The heaters 14 are provided on the periphery of the chamber 10 and heat semiconductor substrates within the chamber 10 during a film formation process.

The top exhaust port 20 is connected to the top portion of the chamber 10 and exhausts gas within the chamber 10 from the top portion of the chamber 10.

The bottom exhaust port 30 is connected to the bottom portion of the chamber 10 and exhausts gas within the chamber 10 from the bottom portion of the chamber 10.

The first exhaust pipes 40 and 41 are connected between the top exhaust port 20 and the first exhaust pump 60, and transmit exhaust gas from the top exhaust port 20 to the first exhaust pump 60.

The first exhaust pump 60 is connected to the first exhaust pipe 41 and draws exhaust gas within the chamber 10 via the top exhaust port 20 and the first exhaust pipes 40 and 41.

The second exhaust pipes 50 and 51 are connected between the bottom exhaust port 30 and the second exhaust pump 70, and transmit exhaust gas from the bottom exhaust port 30 to the second exhaust pump 70.

The second exhaust pump 70 is connected to the second exhaust pipe 51 and draws exhaust gas within the chamber 10 via the bottom exhaust port 30 and the second exhaust pipes 50 and 51.

The first switching valve 80 is provided between the exhaust pipes 40 and 41, and connects or disconnects between the top exhaust port 20 and the first exhaust pump 60.

The second switching valve 90 is provided between the exhaust pipes 50 and 51, and connects or disconnects between the bottom exhaust port 30 and the second exhaust pump 70.

The controller 100 controls constituent elements of the film formation device 1. For example, the controller 100 controls the gas supply part 12 and the heaters 14 to form films on the semiconductor substrates Wt, Wm, and Wb. Further, the controller 100 controls the exhaust pumps 60 and 70 and the switching valves 80 and 90 to exhaust gas within the chamber 10.

More specifically, the controller 100 operates the first and second switching valves 80 and 90 so that the first exhaust pump 60 and the second exhaust pump 70 exhaust gas periodically and alternately. That is, the controller 100 controls a timing of switching between exhaust from the first exhaust pump 60 and exhaust from the second exhaust pump 70. At this time, when the first switching valve 80 connects between the top exhaust port 20 and the first exhaust pump 60 (when the first switching valve 80 is opened), the second switching valve 90 disconnects between the bottom exhaust port 30 and the second exhaust pump 70 (the second switching valve 90 is closed). On the other hand, when the first switching valve 80 disconnects between the top exhaust port 20 and the first exhaust pump 60 (when the first switching valve 80 is closed), the second switching valve 90 connects between the bottom exhaust port 30 and the second exhaust pump 70 (the second switching valve 90 is opened).

Next, an operation of the film formation device 1 is explained.

Figure 2:
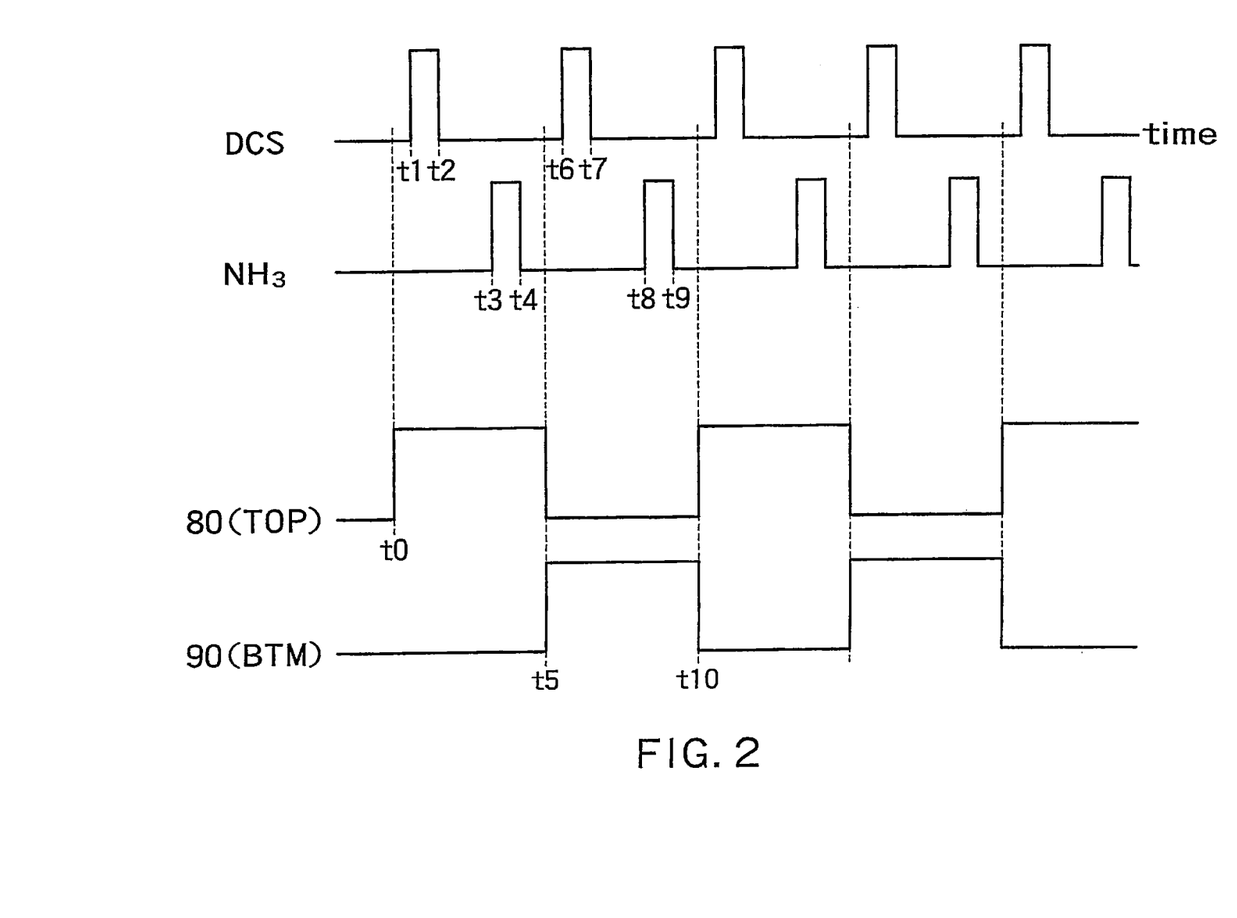
FIG. 2 is a timing chart of an operation of the film formation device 1 according to the first embodiment.

FIG. 2 is a timing chart of an operation of the film formation device 1 according to the first embodiment. In the first embodiment, to form a silicon nitride film on a semiconductor substrate by ALD, DCS (dichlorosilane) gas and ammonium gas are used as process gas. In ALD, the gas supply part 12 supplies DCS gas and ammonium gas alternately to the chamber 10 and forms an atomic-level layer on a semiconductor substrate one by one.

For example, in a time period t1 to t2, the gas supply part 12 supplies DCS gas to the chamber 10. In a time period t3 to t4, the gas supply part 12 supplies ammonium gas to the chamber 10. Supplying the DCS gas and the ammonium gas in a time period t1 to t4 constitutes one gas supply operation (one cycle). A first layer of silicon nitride film is thus formed on a semiconductor substrate.

During a first time period t0 to t5 including the time period t1 to t4, the first switching valve 80 is opened. Gas that has been used for film formation within the chamber 10 is exhausted from the first exhaust pump 60 via the top exhaust port 20 and the first exhaust pipes 40 and 41. During the first time period, the second switching valve 90 is closed.

At t5, the first switching valve 80 is closed and the second switching valve 90 is opened.

Next, in a time period t6 to t7, the gas supply part 12 supplies DCS gas to the chamber 10, and in a time period t8 to t9, the gas supply part 12 supplies ammonium gas to the chamber 10. That is, the gas supply part 12 performs a second gas supply operation. A second layer of silicon nitride film is thus formed on the semiconductor substrate.

During a second time period t5 to t10 including a time period t6 to t9, the second switching valve 90 is opened. Gas that has been used for film formation within the chamber 10 is exhausted from the second exhaust pump 70 via the bottom exhaust port 30 and the second exhaust pipes 50 and 51.

At t10, the second switching valve 90 is closed and the first switching valve 80 is opened.

Thereafter, an operation identical to that from t0 to t10 is repeated, so that silicon nitride films are formed on the semiconductor substrate. As explained above, the film formation device 1 according to the first embodiment switches the exhaust port between the top exhaust port 20 and the bottom exhaust port 30 for every gas supply operation.

According to the first embodiment, process gas is supplied to the chamber 10 and used for forming films on a semiconductor substrate, and then exhausted alternately from the top exhaust port 20 and the bottom exhaust port 30 shown in FIG. 1.

When only the bottom exhaust port 30 is provided, the process gas is exhausted from the bottom portion of the chamber 10. Therefore, the process gas thus easily remains in the top portion of the chamber 10. Therefore, concentration of the process gas in the bottom portion of the chamber 10 is relatively low and concentration of the process gas in the top portion of the chamber 10 is relatively high. As a result, a relatively thick silicon nitride film is formed on the semiconductor substrates Wt arranged in the top portion of the chamber 10, and a relatively thin silicon nitride film is formed on the semiconductor substrate Wb arranged in the bottom portion of the chamber 10. As described above, when only the bottom exhaust port 30 is provided, the film thickness of a material formed on a semiconductor substrate varies depending on the position of the semiconductor substrate within the chamber 10.

On the other hand, the film formation device 1 according to the first embodiment includes a plurality of exhaust ports, that is, includes not only the bottom exhaust port 30 but also the top exhaust port 20. Therefore, process gas is exhausted from the top portion of the chamber 10 as well as the bottom portion thereof. Accordingly, concentration of the process gas is relatively uniform in the top portion and the bottom portion of the chamber 10. As a result, a silicon nitride film is formed on the semiconductor substrates Wt, Wm, and Wb at a substantially equal film thickness. As described above, when the exhaust ports 20 and 30 are provided in the top portion and the bottom portion of the chamber 10, respectively, the film thickness of a material formed on a semiconductor substrate is substantially uniform between semiconductor substrates, not depending much on the position of the semiconductor substrate within the chamber 10.

Because the film thickness is substantially uniform among the semiconductor substrates, it is unnecessary to adjust a film-formation process temperature in some portions of the chamber 10 for the purpose of film thickness adjustment. Therefore, the film quality does not vary and is substantially uniform among the semiconductor substrates. As a result, the film formation device 1 according to the first embodiment can substantially uniformize the film thickness and the film quality among semiconductor substrates.

In the film formation device 1 according to the first embodiment, after a film formation process ends, both the first and second switching valves 80 and 90 can be opened to exhaust gas within the chamber 10 by using both the first and second exhaust pumps 60 and 70. Because the gas within the chamber 10 can be exhausted in a short time, after the film formation process ends, the semiconductor substrates can be taken out in a short time.

In the first embodiment, the first and second switching valves 80 and 90 switch the gas exhaust port alternately between the top exhaust port 20 and the bottom exhaust port 30 at every cycle of supplying DCS gas and ammonium gas. This is because when process gas is exhausted from both the top exhaust port 20 and the bottom exhaust port 30, the process gas may be exhausted before forming a film on a semiconductor substrate. As explained above, in the film formation device 1 according to the first embodiment, the gas exhaust port is switched alternately between the top exhaust port 20 and the bottom exhaust port 30 according to a process gas supply cycle, thereby appropriately maintaining gas exhaust capability.

In the first embodiment, the controller 100 switches the gas exhaust port alternately between the top exhaust port 20 and the bottom exhaust port 30 every time a gas supply operation is performed. However, as explained in the following modifications and embodiments, the controller 100 can also arbitrarily control the number of times of gas supply operations and a timing of performing the gas supply operation, and a timing of switching between exhaust from the first exhaust pump 60 and exhaust from the second exhaust pump 70.

(First Modification)

Figure 3:
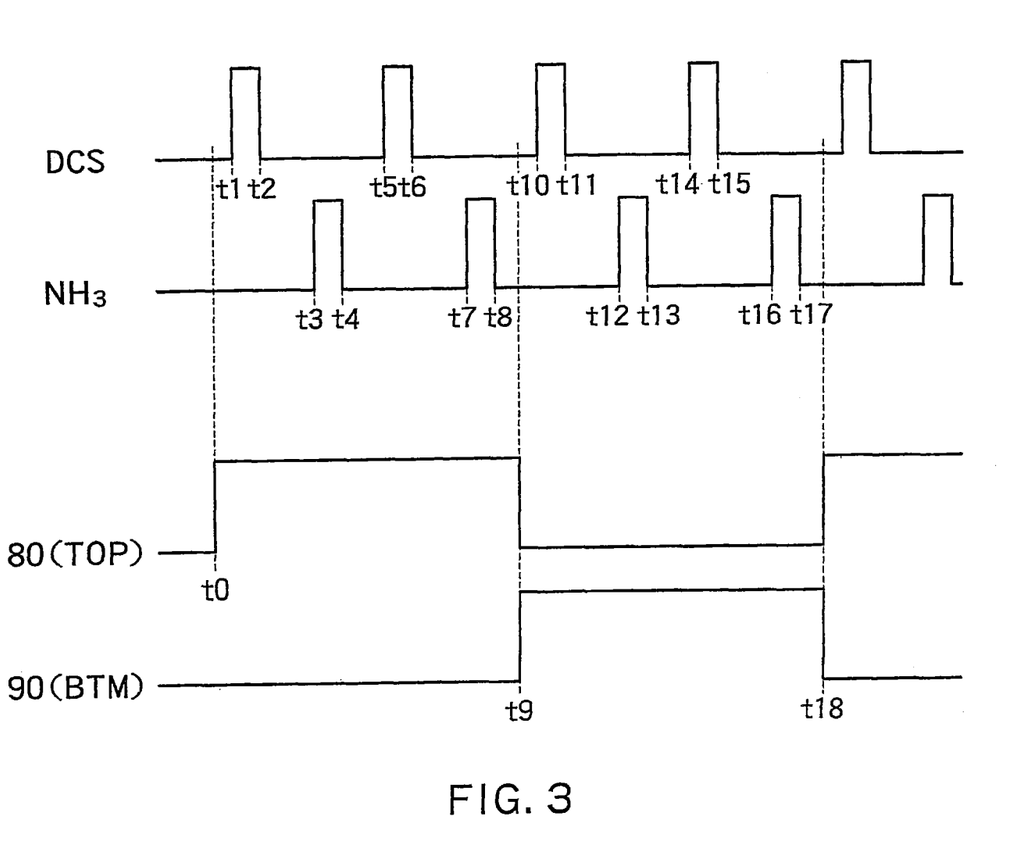
FIG. 3 is a timing chart of a first modification of the first embodiment.

FIG. 3 is a timing chart of a first modification of the first embodiment. In the film formation device 1 according to the first embodiment, the exhaust port is switched alternately between the top exhaust port 20 and the bottom exhaust port 30 every time a gas supply operation is performed.

On the other hand, in the film formation device 1 according to the first modification, an exhaust port is switched alternately between the top exhaust port 20 and the bottom exhaust port 30 at every plural gas supply operations. For example, in FIG. 3, during a first time period t0 to t9 including a time period t1 to t8, the first switching valve 80 is opened and the second switching valve 90 is closed. During a second time period t9 to t18 including a time period t11 to t17, the second switching valve 90 is opened and the first switching valve 80 is closed. That is, the film formation device 1 can switch the exhaust port alternately between the top exhaust port 20 and the bottom exhaust port 30 at every two gas supply operations.

Further, the film formation device 1 can also switch the exhaust port alternately between the top exhaust port 20 and the bottom exhaust port 30 at every N (N is an integer equal to or larger than 2) gas supply operations. As explained above, even when a cycle of switching the gas exhaust port is in accordance with N cycles of gas supply operations, the effects of the embodiment described above are not lost. However, to suppress a variation in the film thickness, the frequency of use of the top exhaust port 20 needs to be equal to that of the bottom exhaust port 30.

Second Embodiment

Figure 4:
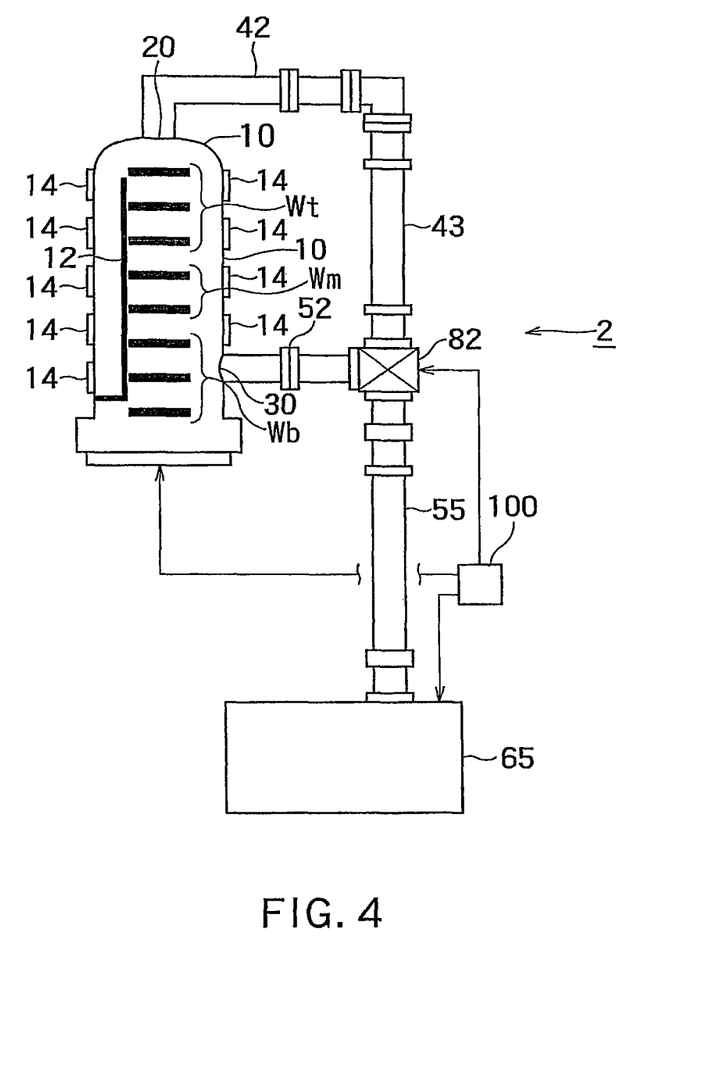
FIG. 4 is a configuration diagram of an example of a film formation device 2 according to a second embodiment.

FIG. 4 is a configuration diagram of an example of a film formation device 2 according to a second embodiment. The film formation device 2 according to the second embodiment is different from the first embodiment in that a part of exhaust pipes connected to the top exhaust port 20 and the bottom exhaust port 30 is shared and an exhaust pump is also shared. Other configurations of the second embodiment are identical to the corresponding ones of the first embodiment.

First exhaust pipes 42 and 43 are connected between the top exhaust port 20 and a common exhaust pipe 55, and transmit exhaust gas from the top exhaust port 20 to the common exhaust pipe 55. A second exhaust pipe 52 is connected between the bottom exhaust port 30 and the common exhaust pipe 55, and transmits exhaust gas from the bottom exhaust port 30 to the common exhaust pipe 55.

The common exhaust pipe 55 is connected between the first and second exhaust pipes 43 and 52 and a common exhaust pump 65, and transmits exhaust gas from the top exhaust port 20 and the bottom exhaust port 30 to the common exhaust pump 65.

A third switching valve 82 is provided between the first and second exhaust pipes 43 and 52 and the common exhaust pipe 55, and connects between the top exhaust port 20 and the common exhaust pipe 55 or between the bottom exhaust port 30 and the common exhaust pipe 55. When the top exhaust port 20 is connected to the common exhaust pipe 55, the bottom exhaust port 30 is disconnected from the common exhaust pipe 55. When the bottom exhaust port 30 is connected to the common exhaust pipe 55, the top exhaust port 20 is disconnected from the common exhaust pipe 55. A state where the third switching valve 82 connects the first exhaust pipe 43 to the common exhaust pipe 55 is referred to as "first state". A state where the third switching valve 82 connects the second exhaust pipe 52 to the common exhaust pipe 55 is referred to as "second state".

The common exhaust pump 65 is connected to the common exhaust pipe 55 and draws exhaust gas within the chamber 10 from the top exhaust port 20 or the bottom exhaust port 30.

The controller 100 switches the third switching valve 82 between the first state and the second state so that the common exhaust pump 65 exhausts gas periodically and alternately from the top exhaust port 20 and the bottom exhaust port 30. That is, the controller 100 controls a timing of switching between exhaust from the top exhaust port 20 and exhaust from the bottom exhaust port 30. As the third switching valve 82 is switched alternately between the first state and the second state, the exhaust port connected to the common exhaust pump 65 is switched alternately between the top exhaust port 20 and the bottom exhaust port 30.

Next, an operation of the film formation device 2 is explained. A timing chart of the operation of the film formation device 2 can be identical to that shown in FIG. 2 or 3.

For example, an operation of the film formation device 2 in the time period t1 to t4 shown in FIG. 2 is identical to that of the film formation device 1 in the time period t1 to t4.

In the time period t0 to t5, the third switching valve 82 is in the first state and gas from the chamber 10 is exhausted from the common exhaust pump 65 via the first exhaust pipes 42 and 43.

At t5, the third switching valve 82 is switched from the first state to the second state. That is, the third switching valve 82 connects between the bottom exhaust port 30 and the common exhaust pump 65 and disconnects between the top exhaust port 20 and the common exhaust pump 65.

An operation of the film formation device 2 in the time period t6 to t7 shown in FIG. 2 is identical to that of the film formation device 1 in the time period t6 to t7.

In the time period t5 to t10, the third switching valve 82 is in the second state and gas from the chamber 10 is exhausted from the common exhaust pump 65 via the second exhaust pipe 52.

At t10, the third switching valve 82 is switched from the second state to the first state.

Thereafter, an operation identical to that from t0 to t10 is repeated, so that a silicon nitride film is formed on a semiconductor substrate.

According to the second embodiment, process gas is supplied to the chamber 10 and used for forming films on the semiconductor substrate and then exhausted alternately from the top exhaust port 20 and the bottom exhaust port 30. Therefore, the second embodiment can also achieve effects identical to those of the first embodiment.

As shown in FIG. 3, in the film formation device 2 according to the second embodiment, the gas exhaust port can be switched alternately between the top exhaust port 20 and the bottom exhaust port 30 at every plural gas supply operations.

Third Embodiment

Figure 5:
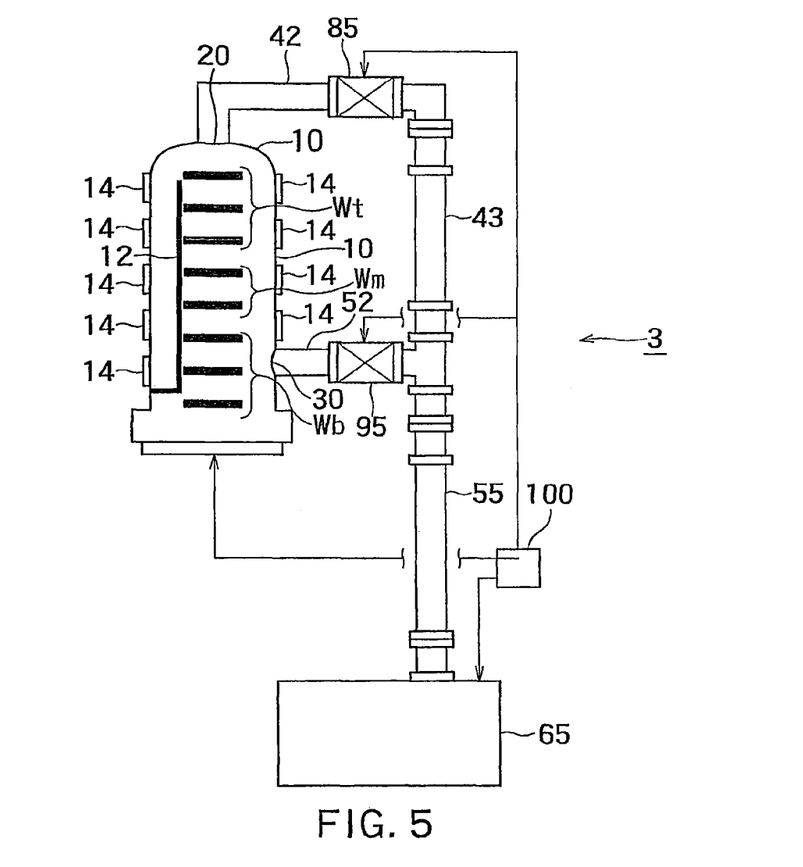
FIG. 5 is a configuration diagram of an example of a film formation device 3 according to a third embodiment.

FIG. 5 is a configuration diagram of an example of a film formation device 3 according to a third embodiment. The film formation device 3 according to the third embodiment is different from the second embodiment in that a switching valve is provided for each of the top exhaust port 20 and the bottom exhaust port 30. Other configurations of the third embodiment are identical to the corresponding ones of the second embodiment.

A fourth switching valve 85 is provided between the first exhaust pipe 42 and the first exhaust pipe 43, and connects or disconnects between the top exhaust port 20 and the common exhaust pipe 55.

A fifth switching valve 95 is provided between the second exhaust pipe 52 and the common exhaust pipe 55, and connects or disconnects between the bottom exhaust port 30 and the common exhaust pipe 55.

The controller 100 operates the fourth and fifth switching valves 85 and 95 so that the common exhaust pump 65 exhausts gas periodically and alternately from the top exhaust port 20 and the bottom exhaust port 30. That is, the controller 100 controls a timing of switching between exhaust from the first exhaust pump 60 and exhaust from the second exhaust pump 70. More specifically, when the fourth switching valve 85 connects between the top exhaust port 20 and the common exhaust pump 65 (when the fourth switching valve 85 is opened), the fifth switching valve 95 disconnects between the bottom exhaust port 30 and the common exhaust pump 65 (the fifth switching valve 95 is closed). On the other hand, when the fourth switching valve 85 disconnects between the top exhaust port 20 and the common exhaust pump 65 (when the fourth switching valve 85 is closed), the fifth switching valve 95 connects between the bottom exhaust port 30 and the common exhaust pump 65 (the fifth switching valve 95 is opened).

Operations of the fourth and fifth switching valves 85 and 95 can be identical to those of the first and second switching valves 80 and 90 according to the first embodiment. Functions of the common exhaust pipe 55 and the common exhaust pump 65 can be identical to those of the second embodiment. Accordingly, operations of the film formation device 3 according to the third embodiment can be easily understood from the first and second embodiments, and thus explanations thereof will be omitted.

According to the third embodiment, process gas is supplied to the chamber 10 and used for forming films on a semiconductor substrate, and then exhausted alternately from the top exhaust port 20 and the bottom exhaust port 30. Therefore, the third embodiment can also achieve effects identical to those of the first and second embodiments.

As shown in FIG. 5, in the film formation device 3 according to the third embodiment, the gas exhaust port can be switched alternately between the top exhaust port 20 and the bottom exhaust port 30 at every plural gas supply operations.

(Second Modification)

Figure 6:
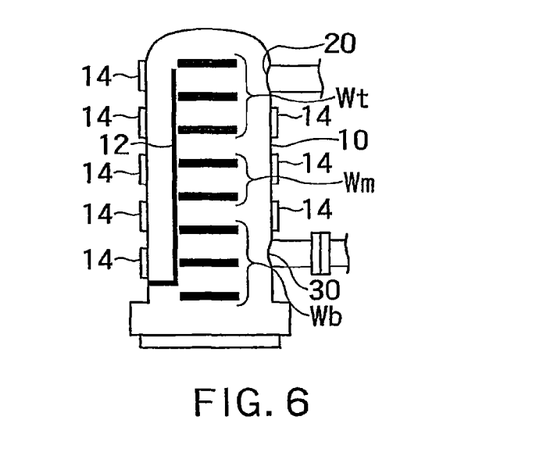
FIG. 6 is a configuration diagram of an example of a second modification of the first to third embodiments.

FIG. 6 is a configuration diagram of an example of a second modification of the first to third embodiments. In the first to third embodiments, the top exhaust port 20 is opened upward in the top portion of the chamber 10. On the other hand, in the second modification, as shown in FIG. 6, the top exhaust port 20 is opened horizontally in an upper sidewall of the chamber 10. In this case, gas is horizontally exhausted, and the direction of exhaust from the top exhaust port 20 is the same as the direction of exhaust from the bottom exhaust port 30. Therefore, film formation conditions in the top portion of the chamber 10 become more identical to those in the bottom portion thereof. As a result, it is possible to further uniformize the film thickness of a film formed on a semiconductor substrate among semiconductor substrates.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a chamber capable of accommodating therein a plurality of semiconductor substrates;
a gas supply part periodically supplying a plurality of kinds of process gas to the chamber;
a top exhaust port connected to a top portion of the chamber, and which exhausts gas within the chamber;
a bottom exhaust port connected to a bottom portion of the chamber, and which exhausts gas within the chamber;
a controller controlling a timing of supplying the plurality of kinds of process gas from the gas supply part and a timing of switching between exhaust from the top exhaust port and exhaust from the bottom exhaust port;
a first exhaust pipe connected to the top exhaust port;
a second exhaust pipe connected to the bottom exhaust port;
a common exhaust pipe connected to the first and second exhaust pipes; and
a common exhaust pump connected to the common exhaust pipe;
a top switching valve provided in the first exhaust pipe and connects or disconnects between the top exhaust port and the common exhaust pipe, and
a bottom switching valve provided in the second exhaust pipe and connects or disconnects between the bottom exhaust port and the common exhaust pipe, wherein
the controller switches one time between exhausting from the top exhaust port and exhausting from the bottom exhaust port during at least one cycle of supplying the plurality of kinds of process gas from the gas supply part being performed,
when the top switching valve connects between the top exhaust port and the common exhaust pipe, the bottom switching valve disconnects between the bottom exhaust port and the common exhaust pipe, when the top switching valve disconnects between the top exhaust port and the common exhaust pipe, the bottom switching valve connects between the bottom exhaust port and the common exhaust pipe, the controller switches between exhaust from the top exhaust port and exhaust from the bottom exhaust port in a timing of supplying process gas from the gas supply part is performed for N times (N is an integer equal to or larger than 1), the bottom exhaust port is provided at a position higher than a lowest semiconductor substrate in the chamber, and the exhausting time of the top exhaust port in one or more cycles is substantially equal to the exhausting time of the bottom exhaust port in one or more cycles.

2. The apparatus of claim 1, further comprising:
a first exhaust pump connected to the first exhaust pipe; and
a second exhaust pump connected to the second exhaust pipe.

3. The apparatus of claim 2, further comprising:
a first switching valve provided in the first exhaust pipe and connects or disconnects between the top exhaust port and the first exhaust pump; and
a second switching valve provided in the second exhaust pipe and connects or disconnects between the bottom exhaust port and the second exhaust pump.

4. The apparatus of claim 3, wherein
when the first switching valve connects between the top exhaust port and the first exhaust pump, the second switching valve disconnects between the bottom exhaust port and the second exhaust pump, and
when the first switching valve disconnects between the top exhaust port and the first exhaust pump, the second switching valve connects between the bottom exhaust port and the second exhaust pump.

5. A semiconductor manufacturing apparatus comprising:
a chamber capable of accommodating therein a plurality of semiconductor substrates;
a gas supply part periodically supplying a plurality of kinds of process gas to the chamber;
a top exhaust port connected to a top portion of the chamber, and which exhausts gas within the chamber;
a bottom exhaust port connected to a bottom portion of the chamber, and which exhausts gas within the chamber;
a controller controlling a timing of supplying the plurality of kinds of process gas from the gas supply part and a timing of switching between exhaust from the top exhaust port and exhaust from the bottom exhaust port;
a first exhaust pipe connected to the top exhaust port;
a second exhaust pipe connected to the bottom exhaust port;
a common exhaust pipe connected to the first and second exhaust pipes; and
a common exhaust pump connected to the common exhaust pipe, wherein
the controller switches one time between exhausting from the top exhaust port and exhausting from the bottom exhaust port during at least one cycle of supplying the plurality of kinds of process gas from the gas supply part being performed,
a shared switching valve provided between the first exhaust pipe and the common exhaust pipe and between the second exhaust pipe and the common exhaust pipe,
the shared switching valve switches between a first state where the first exhaust pipe is connected to the common exhaust pipe and a second state where the second exhaust pipe is connected to the common exhaust pipe,
the shared switching valve switches alternately between the first state and the second state.

* * * * *